United States Patent
Chang et al.

(10) Patent No.: US 9,905,519 B1
(45) Date of Patent: Feb. 27, 2018

(54) ELECTRONIC STRUCTURE PROCESS

(71) Applicant: VIA Alliance Semiconductor Co., Ltd., Shanghai (CN)

(72) Inventors: Wen-Yuan Chang, New Taipei (TW); Wei-Cheng Chen, New Taipei (TW); Chen-Yueh Kung, New Taipei (TW)

(73) Assignee: VIA Alliance Semiconductor Co., Ltd., Shanghai (CN)

( * ) Notice: Subject to any disclaimer, the term of this patent is extended or adjusted under 35 U.S.C. 154(b) by 0 days.

(21) Appl. No.: 15/636,648

(22) Filed: Jun. 29, 2017

Related U.S. Application Data

(60) Provisional application No. 62/380,960, filed on Aug. 29, 2016.

(30) Foreign Application Priority Data

May 11, 2017 (TW) .............................. 106115536 A

(51) Int. Cl.
*H01L 23/00* (2006.01)
*H01L 25/04* (2014.01)
*H01L 27/00* (2006.01)

(52) U.S. Cl.
CPC .............. *H01L 24/04* (2013.01); *H01L 24/14* (2013.01); *H01L 25/04* (2013.01); *H01L 27/00* (2013.01)

(58) Field of Classification Search
CPC ......... H01L 24/02; H01L 24/03; H01L 24/04; H01L 24/10; H01L 24/12; H01L 24/14; H01L 24/18; H01L 24/26; H01L 24/42
See application file for complete search history.

(56) References Cited

U.S. PATENT DOCUMENTS

2013/0105213 A1* 5/2013 Hu ...................... H01L 21/4846
174/266
2016/0126175 A1* 5/2016 Hsu ......................... H01L 24/00
174/255

* cited by examiner

*Primary Examiner* — Cuong Q Nguyen
(74) *Attorney, Agent, or Firm* — JCIPRNET

(57) ABSTRACT

An electronic structure process includes the following steps. A redistribution structure and a carrier plate are provided. A plurality of first bonding protruding portions and a first supporting structure are formed on the redistribution structure. A first encapsulated material is formed and filled between a first opening and the first bonding protruding portions. The carrier plate is removed. A plurality of second bonding protruding portions and a second supporting structure are formed on the redistribution structure. A second encapsulated material is formed and filled between a second opening and the second bonding protruding portions.

14 Claims, 21 Drawing Sheets

ELECTRONIC STRUCTURE PROCESS

CROSS-REFERENCE TO RELATED APPLICATION

This application claims the priority benefits of U.S. provisional application Ser. No. 62/380,960, filed on Aug. 29, 2016, and Taiwan application serial no. 106115536, filed on May 11, 2017. The entirety of each of the above-mentioned patent applications is hereby incorporated by reference herein and made a part of this specification.

BACKGROUND OF THE INVENTION

Field of the Invention

The invention relates to an electronic structure process, and more particularly, to an electronic structure process for the field of chip package.

Description of Related Art

In the field of semiconductor packaging technology, a chip carrier is an electronic device connecting an IC chip to the next level, such as a motherboard or module board. A circuit board having high wiring density is often used as a chip carrier having a high contact number. The circuit board is mainly formed by the alternate stacking of a plurality of patterned conductive layers and a plurality of dielectric layers, and two patterned conductive layers can be electrically connected to each other via a conductive via. However, in the current circuit board and chip packaging process, the issue of warping and the issue of insufficient structural strength of the product readily occur in the manufacturing process.

SUMMARY OF THE INVENTION

The invention provides an electronic structure process that can increase structural strength and lower production cost of the process thereof.

The invention provides an electronic structure process including the following steps. A redistribution structure and a carrier plate are provided, wherein the redistribution structure is disposed on the carrier plate. A plurality of first bonding protruding portions and a first supporting structure are formed on the redistribution structure. The first supporting structure has a plurality of first openings, and the first bonding protruding portions are located in the first openings. A first encapsulated material is formed and filled between the first openings and the first bonding protruding portions. The carrier plate is removed. A plurality of second bonding protruding portions and a second supporting structure are formed on the redistribution structure. The second supporting structure has a plurality of second openings, and the second bonding protruding portions are located in the second openings. The redistribution structure is located between the first supporting structure and the second supporting structure. A second encapsulated material is formed and filled between the second openings and the second bonding protruding portions.

Based on the above, in the electronic structure process of the invention, since a supporting structure is disposed in the peripheral region of each of the electronic structures of the electronic structure array, warping occurring in the process can be alleviated, and the structural strength of the electronic structure array can be increased and production cost of the process thereof can be reduced, such that the yield of the electronic structure is increased. Moreover, the disposition of the supporting structure can also improve the overall structural strength of each of the electronic structures.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
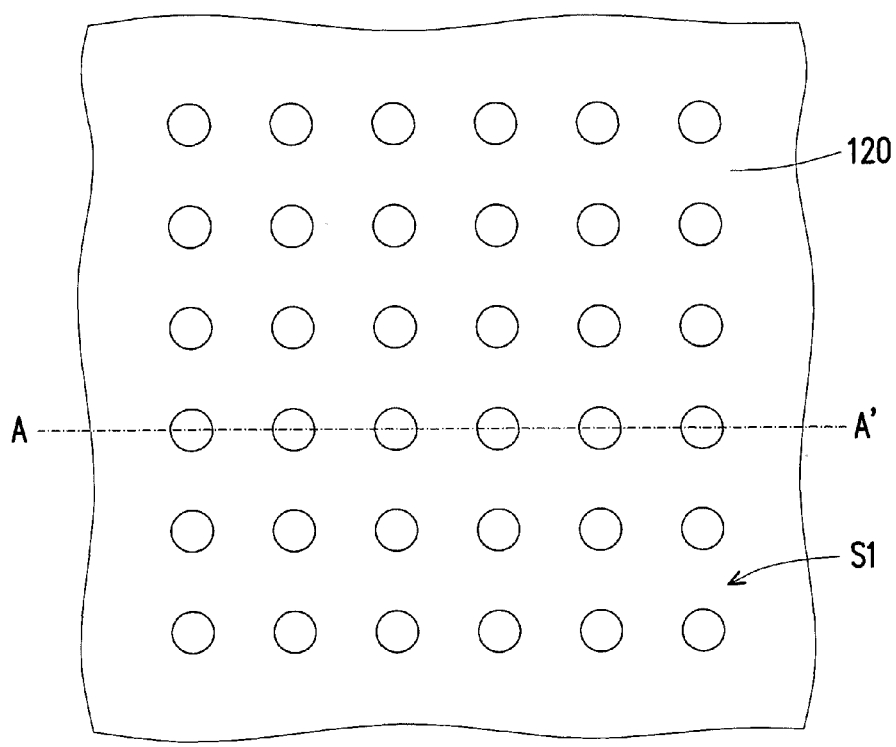
FIG. 1A to FIG. 1D are top views of the electronic structure process of an embodiment of the invention in order.
Figure 2A:
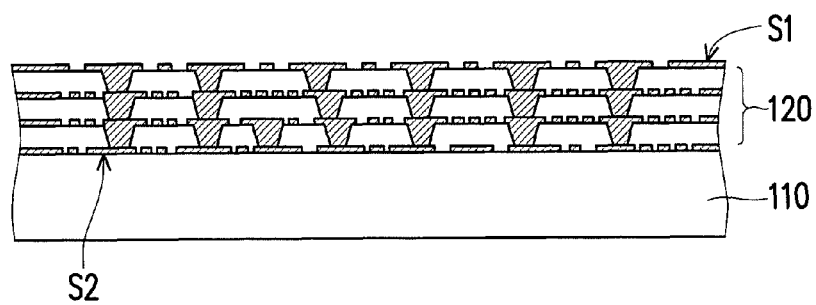
FIG. 2A to FIG. 2I are respectively cross-sectional views of the structures of FIG. 1A to FIG. 1I along line A-A' of FIG. 1A.
Figure 4A:
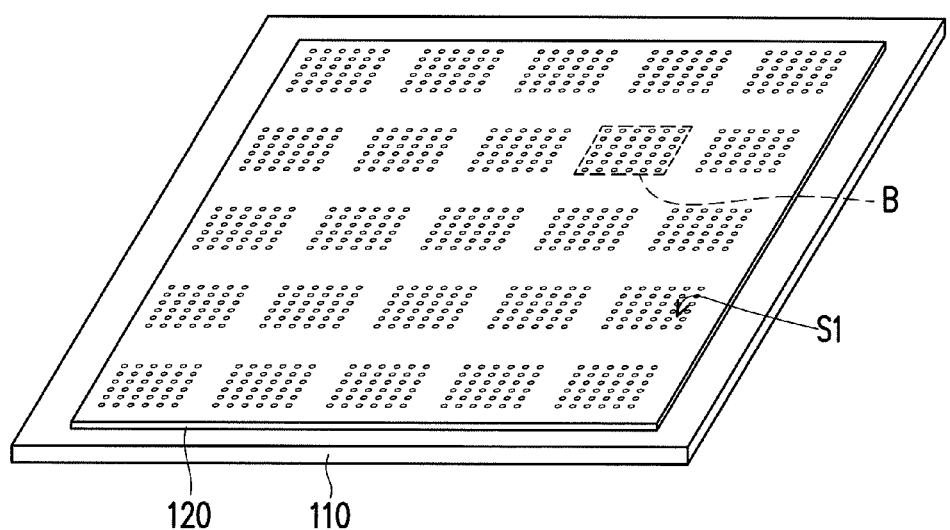
FIG. 4A is a perspective view of the structures of FIG. 1A and FIG. 2A in complete state.

Referring to FIG. 1A, FIG. 2A, and FIG. 4A, the structures of FIG. 1A and FIG. 2A in complete state are shown in FIG. 4A, i.e., the structure of FIG. 4A is partially shown in FIG. 1A and FIG. 2A. In the electronic structure process of the present embodiment, a carrier plate 110 and a redistribution structure 120 are provided, wherein the redistribution structure 120 has a first surface S1 and a second surface S2 opposite to each other, and the redistribution structure 120 is disposed on the carrier plate 110. Specifically, the second surface S2 of the redistribution structure 120 is connected to the carrier plate 110. The redistribution structure 120 can be directly manufactured on the carrier plate 110 via a build-up process, and sufficient teaching, suggestion, and implementation of the detailed manufacturing method thereof can be obtained from the general knowledge of a relating field and are therefore not repeated herein. For ease of explaining, FIG. 1A and FIG. 4A only show a portion of the patterned circuit located on the first surface S1 in FIG. 2A.

Figure 1B:
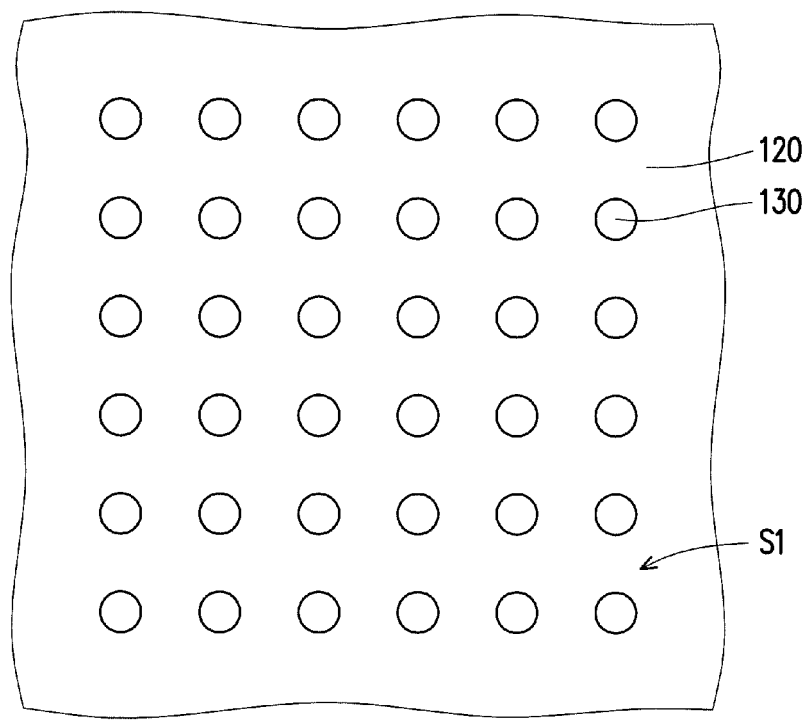
Figure 2B:
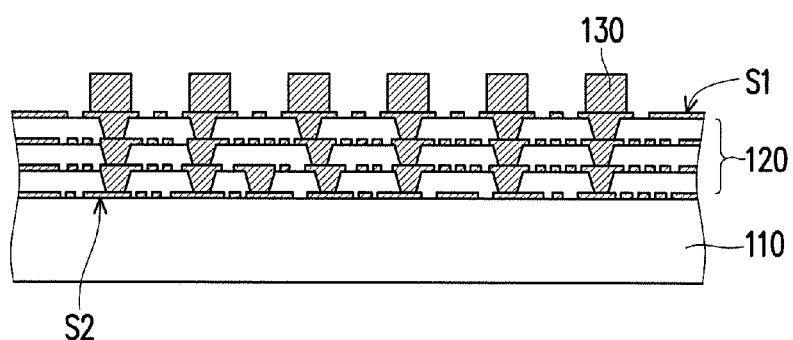

Please refer to FIG. 1B and FIG. 2B. After the above steps, a plurality of first bonding protruding portions 130 is foiled on the redistribution structure 120. Specifically, after the redistribution structure 120 is manufactured, conductive columns are forming on a portion of the patterned circuit of the first surface S1 of the redistribution structure 120 via electroplating, and the material of the conductive columns is, for instance, copper or other types of metal. The arrangement method of the plurality of first bonding protruding portions 130 is, for instance, an array arrangement as shown in FIG. 1B, but in other embodiments, the plurality of first bonding protruding portions 130 can be framed into a different pattern via electroplating based on electrical property requirements, and the invention is not limited thereto.

Figure 1C:
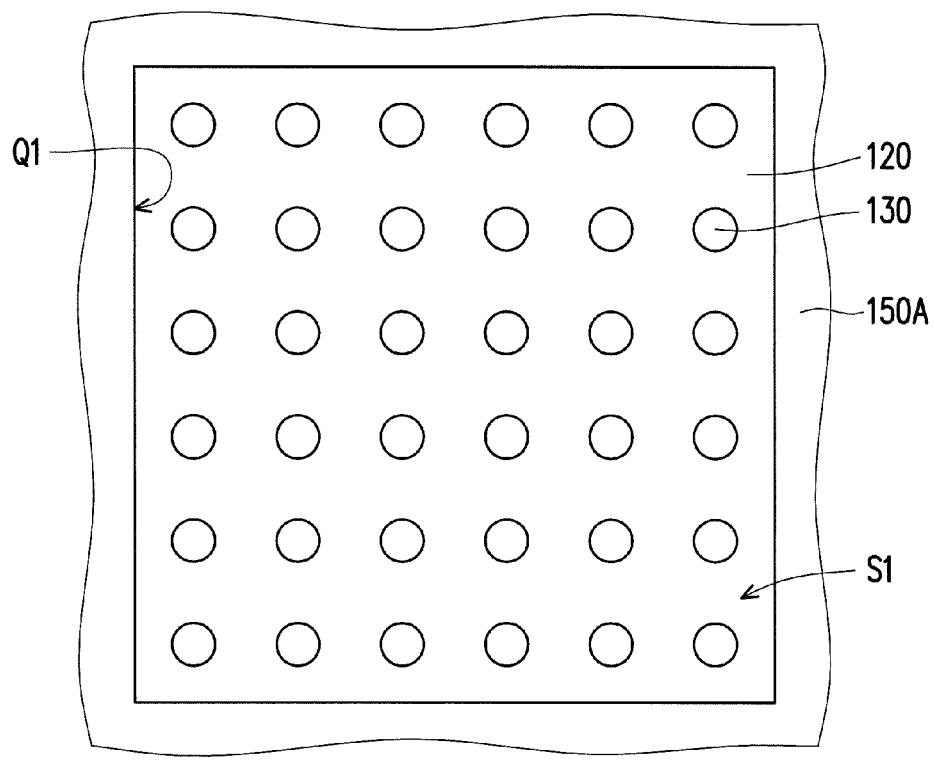
Figure 2C:
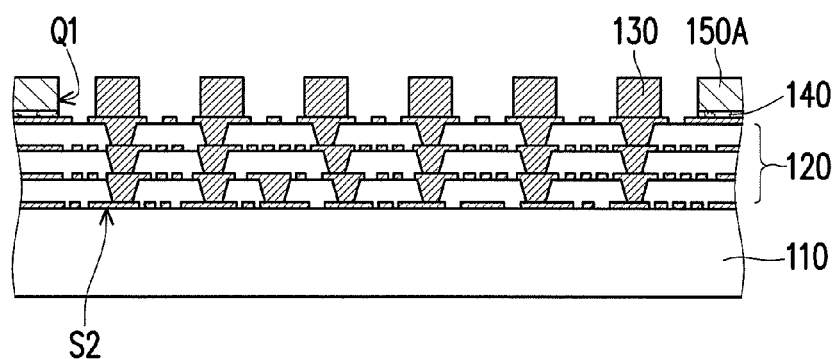
Figure 3B:
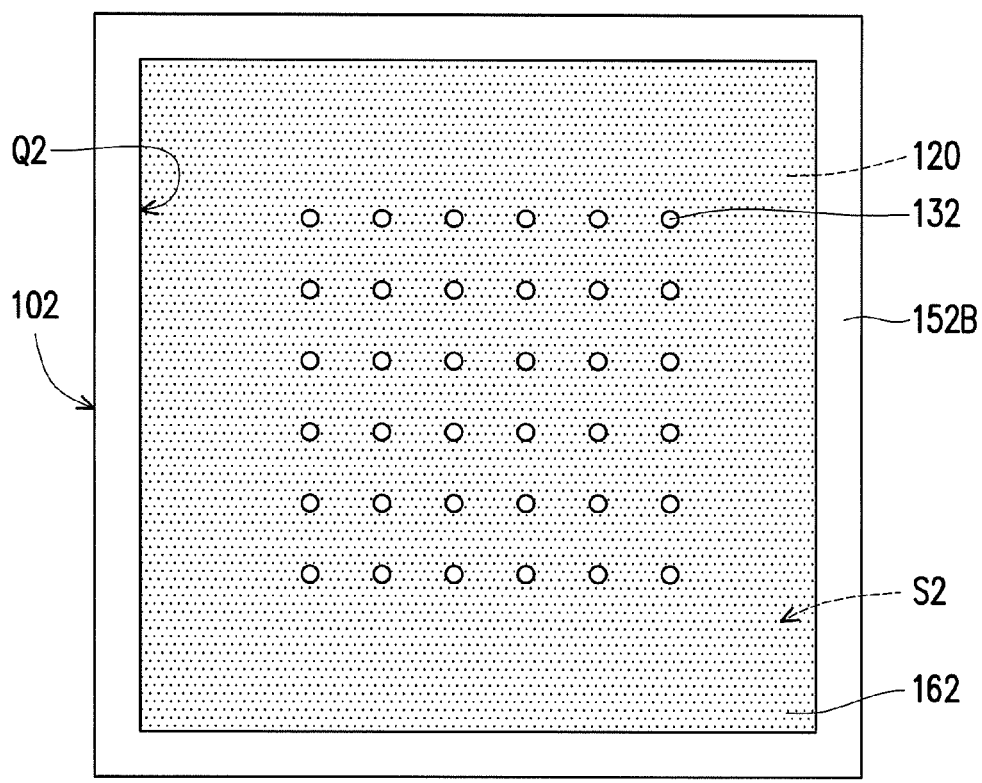
Figure 4B:
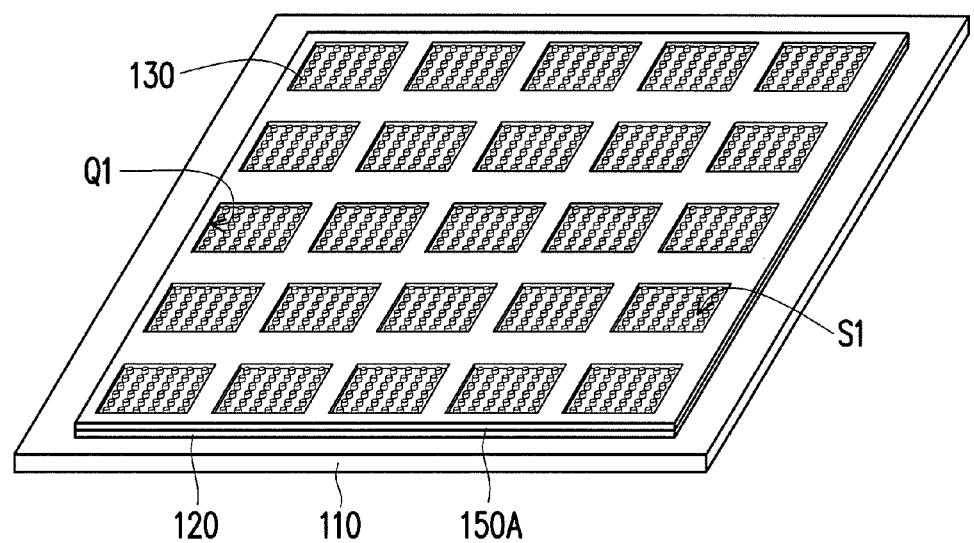
FIG. 4B is a perspective view of the structures of FIG. 1C and FIG. 2C in complete state.

Referring to FIG. 1C, FIG. 2C, and FIG. 4B, the structures of FIG. 1C and FIG. 2C in complete state are shown in FIG. 4B, i.e., the structure of FIG. 4B is partially shown in FIG. 1C and FIG. 2C. After the above steps, a first supporting structure 150A is formed on the redistribution structure 120, wherein the first supporting structure 150A has a plurality of first openings Q1, and the plurality of first bonding protruding portions 130 is located in the first openings Q1. In the present embodiment, the step further includes adhering the first supporting structure 150A on the redistribution structure 120 via a first adhesive layer 140 to fix the first supporting structure 150A on the redistribution structure 120. Specifically, the first adhesive layer 140 is disposed between the redistribution structure 120 and the first supporting structure 150A. The first supporting structure 120 is one reticular structure, such as one reticular reinforced supporting member. As a result, the supporting structure having a plurality of openings and the carrier plate can alleviate warping occurring in the packaging process, in particular a larger package, and the effect is more significant when the overall thickness is smaller. Moreover, the first supporting structure 150A having the plurality of first openings Q1 can increase the structural strength of the electronic structure array 50 (refer to FIG. 4E) and reduce the production cost of the manufacture thereof, and therefore the yield of the electronic structure 100 (refer to FIGS. 1I and 2I and FIG. 3B) can be increased.

Figure 1D:
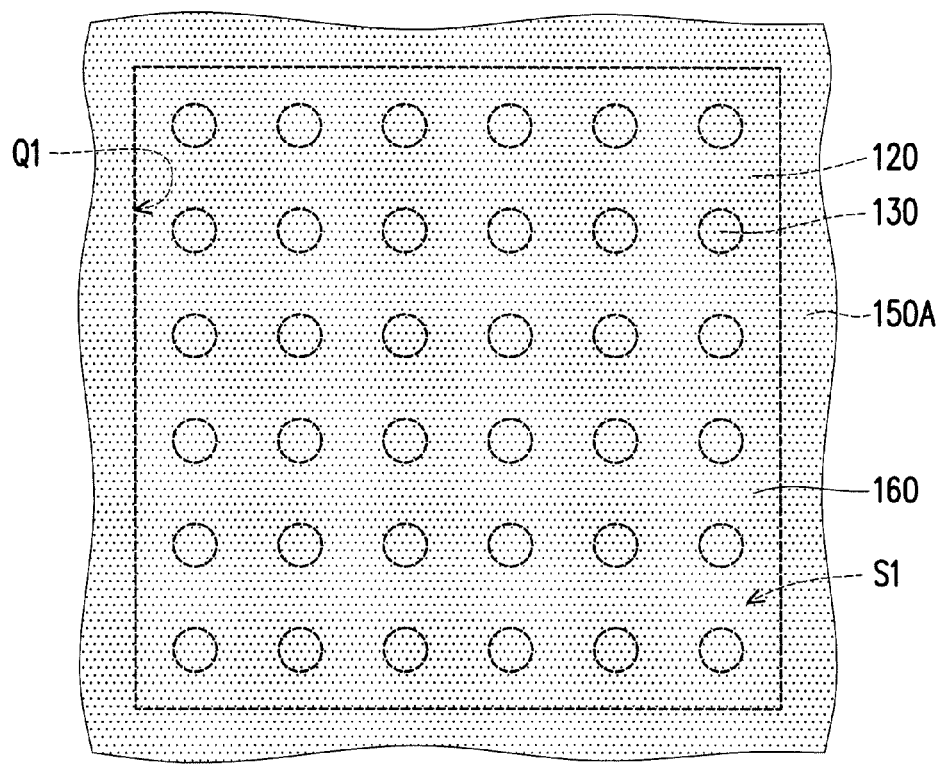
Figure 2D:
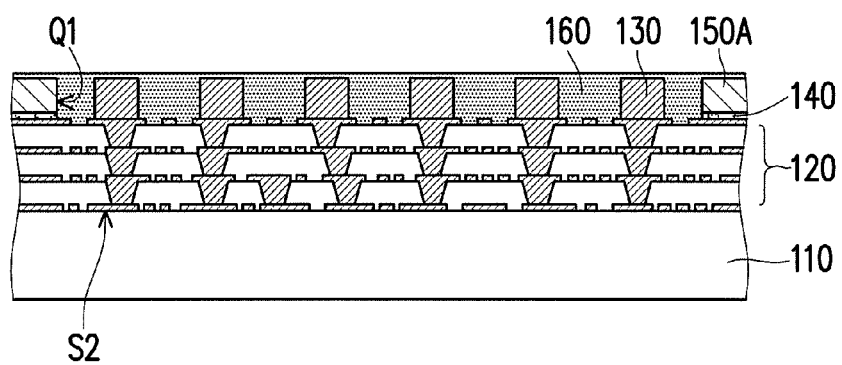

Please refer to FIG. 1D and FIG. 2D. After the above steps, a first encapsulated material 160, such as molding compound, is formed to cover the first supporting structure 150A and the first bonding protruding portions 130, and the first encapsulated material 160 is filled between the first openings Q1 and the first bonding protruding portions 130. In other words, in the present step, the first encapsulated material 160 is filled on the first supporting structure 150A and completely covers the first supporting structure 150A and the first bonding protruding portions 130 such that the first encapsulated material 160 is completely filled in each of the first openings Q1 in the first supporting structure 150A to fix the first supporting structure 150A and the first bonding protruding portions 130. In other embodiments, the first encapsulated material 160 can also be filled between the first openings Q1 and the first bonding protruding portions 130 and not cover the first supporting structure 150A and the first bonding protruding portions 130, and the invention is not limited thereto.

Figure 1E:
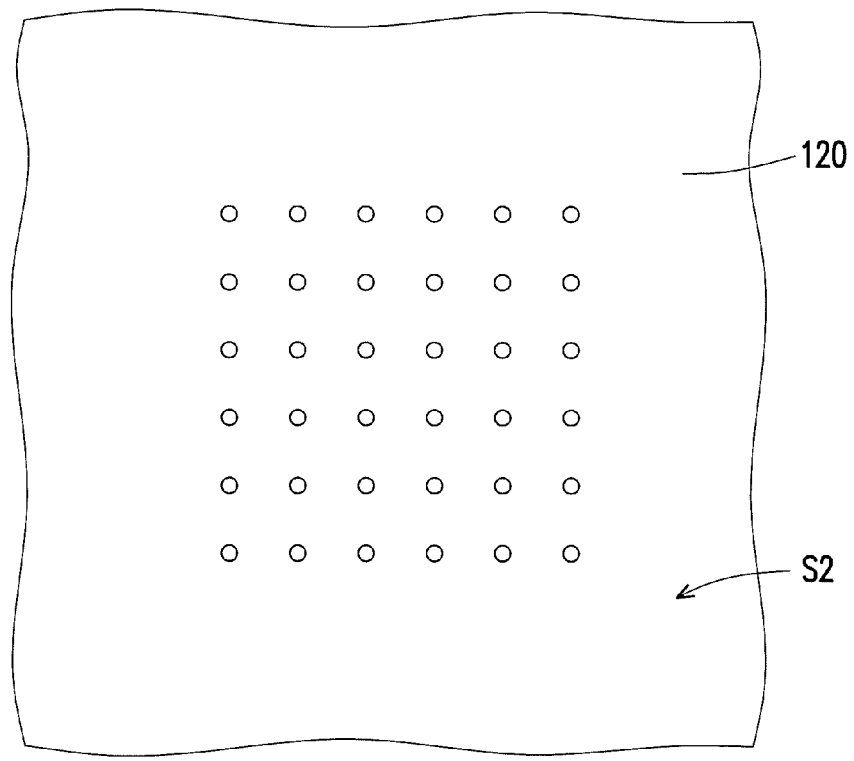
FIG. 1E to FIG. 1G are bottom views of a subsequent process of the electronic structure process of FIG. 1D in order.
Figure 2E:
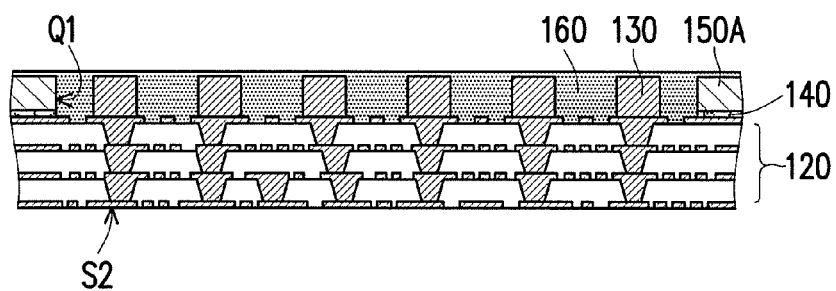
Figure 4C:
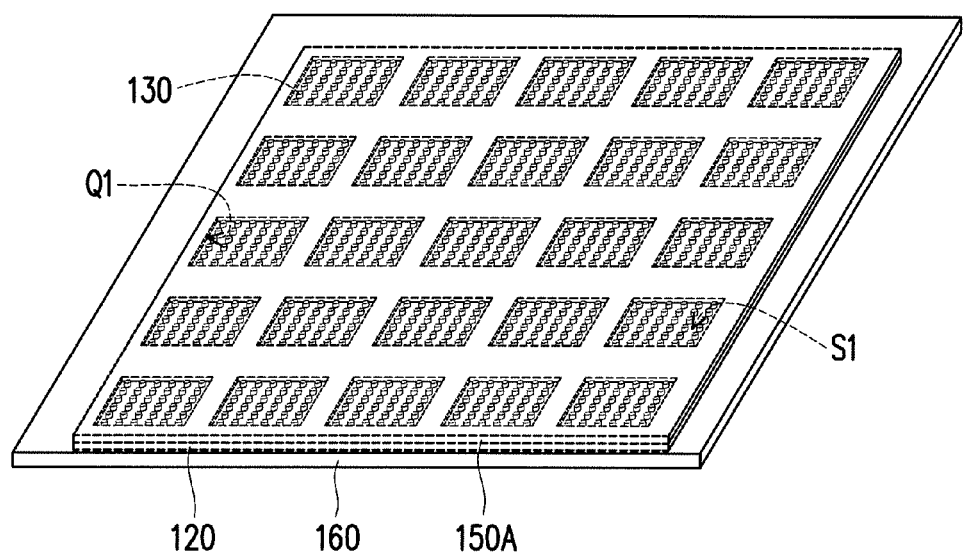
FIG. 4C is a perspective view of the structures of FIG. 1E and FIG. 2E in complete state.

Referring to FIG. 1E, FIG. 2E, and FIG. 4C, the structures of FIG. 1E and FIG. 2E in complete state are shown in FIG. 4C, i.e., the structure of FIG. 4C is partially shown in FIG. 1E and FIG. 2E. After the steps above, the carrier plate 110 is removed. Since the first encapsulated material 160 is completely filled in each of the openings Q1, the first supporting structure 150A and the redistribution structure 120 are fixedly connected to each other via the first encapsulated material 160 and do not separate. For ease of explaining, FIG. 1E only shows a portion of the patterned circuit located on the second surface S2 in FIG. 2E.

Figure 1F:
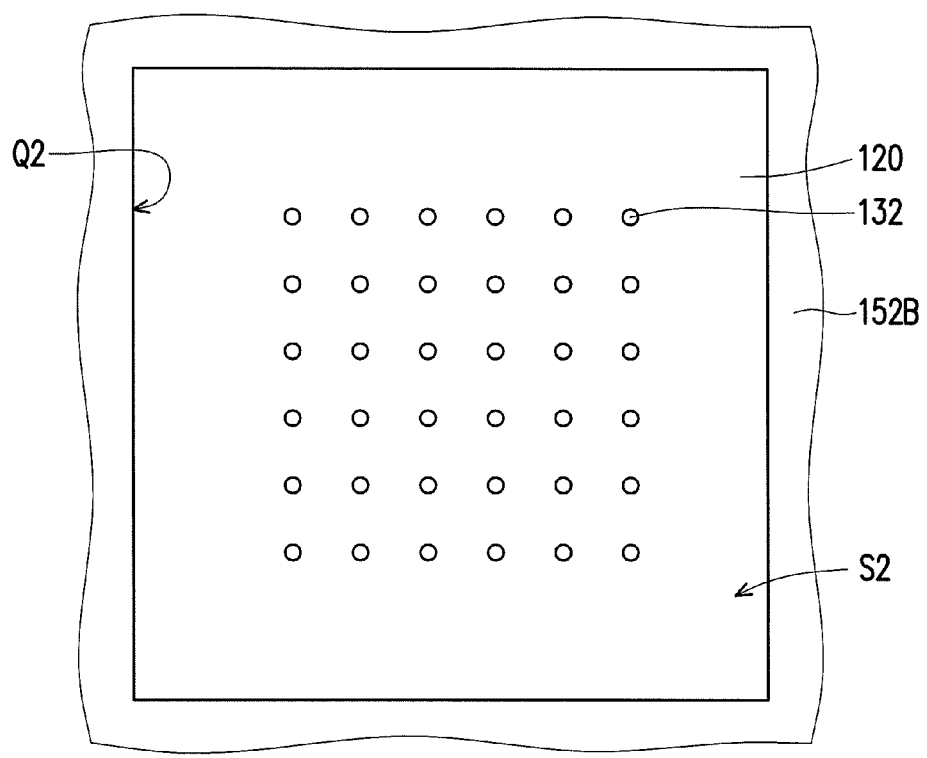
Figure 2F:
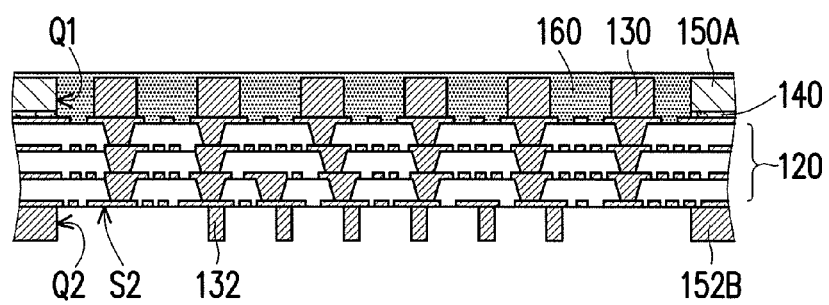
Figure 4D:
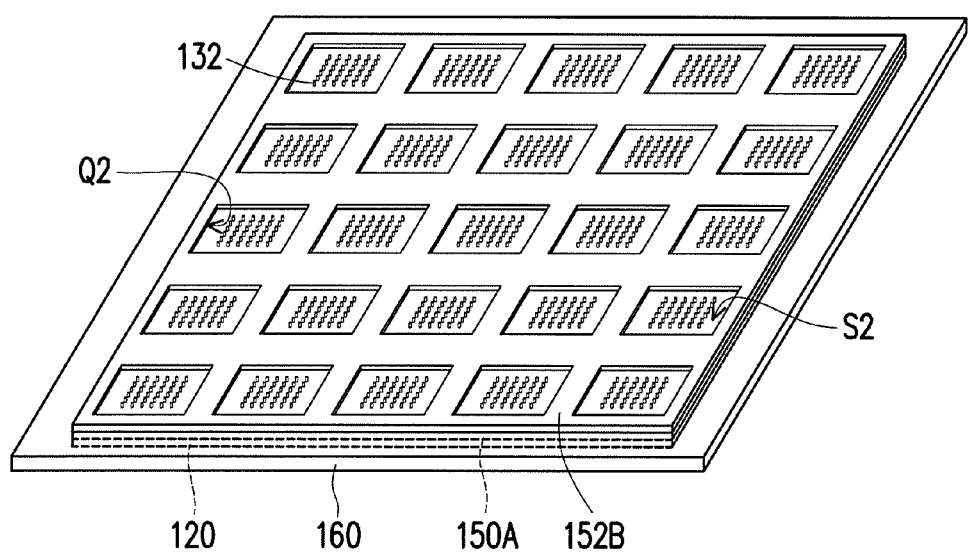
FIG. 4D is a perspective view of the structures of FIG. 1F and FIG. 2F in complete state.

Referring to FIG. 1F, FIG. 2F, and FIG. 4D, the structures of FIG. 1F and FIG. 2F in complete state are shown in FIG. 4D, i.e., the structure of FIG. 4D is partially shown in FIG. 1F and FIG. 2F. After the above steps, a plurality of second bonding protruding portions 132 and a second supporting structure 152B are formed on the redistribution structure 120, wherein the second supporting structure 152B has a plurality of second openings Q2, the second bonding protruding portions 132 are located in the second openings Q2, and the redistribution structure 120 is located between the first supporting structure 150A and the second supporting structure 152B. Specifically, after the above steps, conductive columns are formed on a portion of the patterned circuit of the second surface S2 of the redistribution structure 120 via electroplating. In the present embodiment, the material and arrangement method of the conductive columns can be the same as or different from the first bonding protruding portions 130 based on electric property requirements, and the invention is not limited thereto. At the same time, in the step of forming the conductive columns via electroplating, the second supporting structure 152B is also formed via electroplating. In other words, in the present embodiment, the second supporting structure 152B and the plurality of second bonding protruding portions 132 can be formed on the redistribution structure 120 at the same time via electroplating, that is, the second supporting structure 152B and the second bonding protruding portions 132 are integrally formed. As a result, the material for forming the second supporting structure 152B can be reduced. The second supporting structure 152B is one reticular structure similar to the first supporting structure 150A, such as one reticular reinforced supporting member. As a result, warping occurring in the packaging process can be alleviated, in particular at locations of the redistribution structure 120 having a smaller thickness (refer to FIG. 2E). Moreover, the second supporting structure 152B having the plurality of second openings Q2 can increase the structural strength of the electronic structure array 50 (refer to FIG. 4E) and reduce the production cost of the manufacture thereof, and therefore the yield of the electronic structure 100 (refer to FIGS. 1I and 2I and FIG. 3B) can be increased.

Figure 1G:
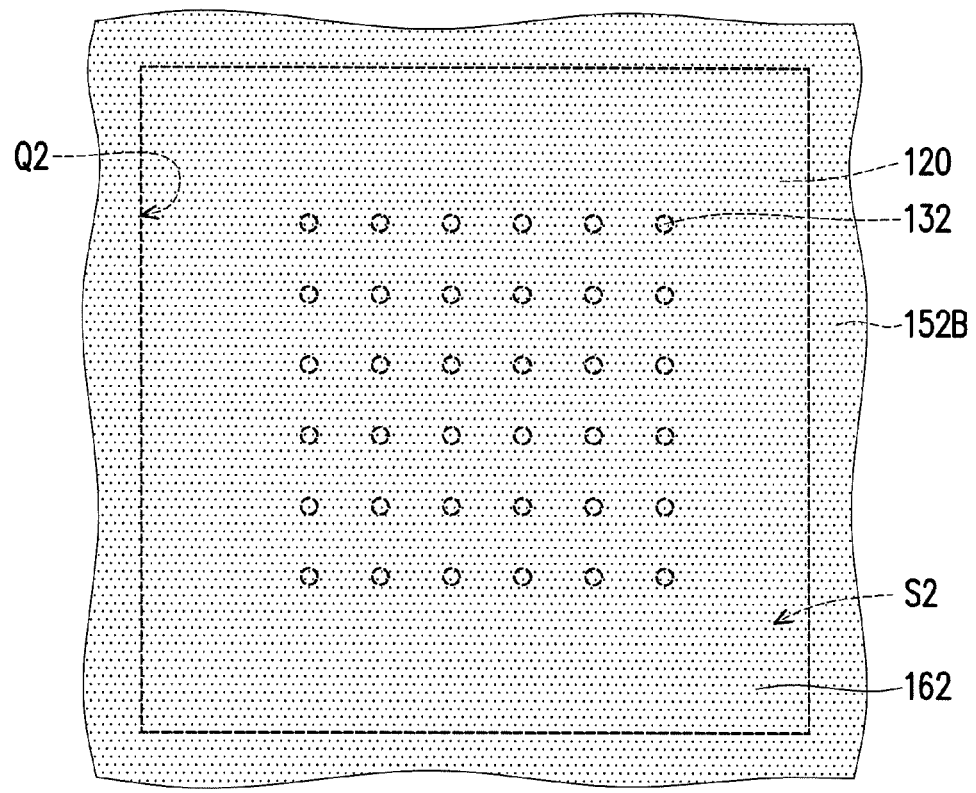
Figure 2G:
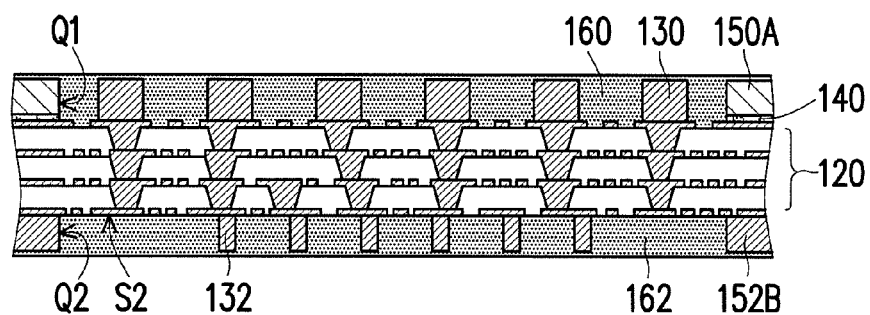

Please refer to FIG. 1G and FIG. 2G. After the above steps, a second encapsulated material 162, such as molding compound, is formed to cover the second supporting structure 152B and the second bonding protruding portions 132, and the second encapsulated material 162 is filled between the second openings Q2 and the second bonding protruding portions 132. In other words, in the present step, the second encapsulated material 162 is filled on the second supporting structure 152B and completely covers the second supporting structure 152B and the second bonding protruding portions 132 such that the second encapsulated material 162 is completely filled in each of the second openings Q2 in the second supporting structure 152B to fix the second supporting structure 152B and the second bonding protruding portions 132. In other embodiments, the second encapsulated material 162 can also be filled between the second openings Q2 and the second bonding protruding portions 132 and not cover the second supporting structure 152B and the second bonding protruding portions 132, and the invention is not limited thereto.

Figure 1H:
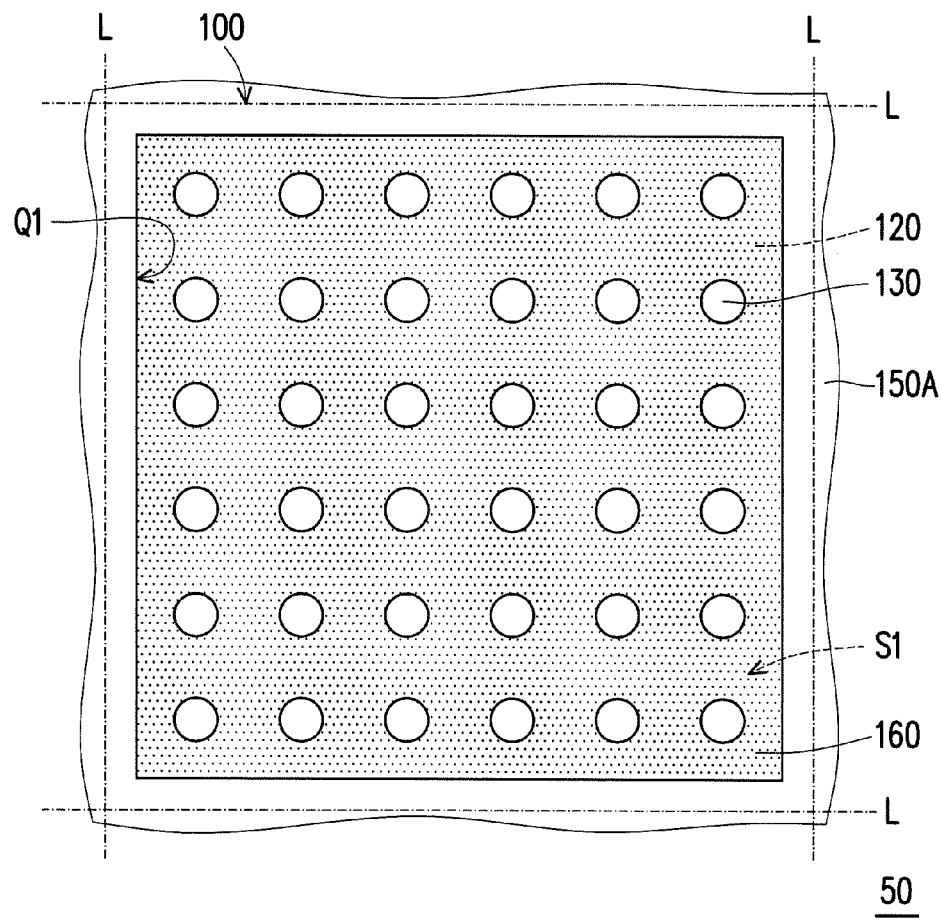
FIG. 1H to FIG. 1I are bottom views of a subsequent process of the electronic structure process of FIG. 1G in order.
Figure 2H:
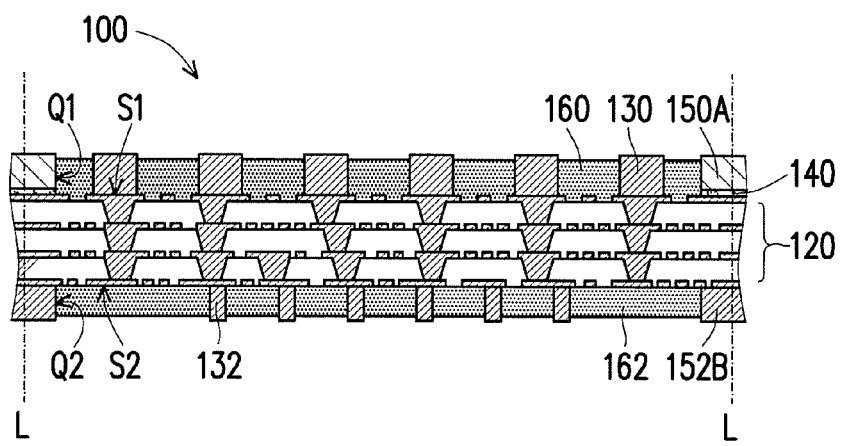
Figure 3A:
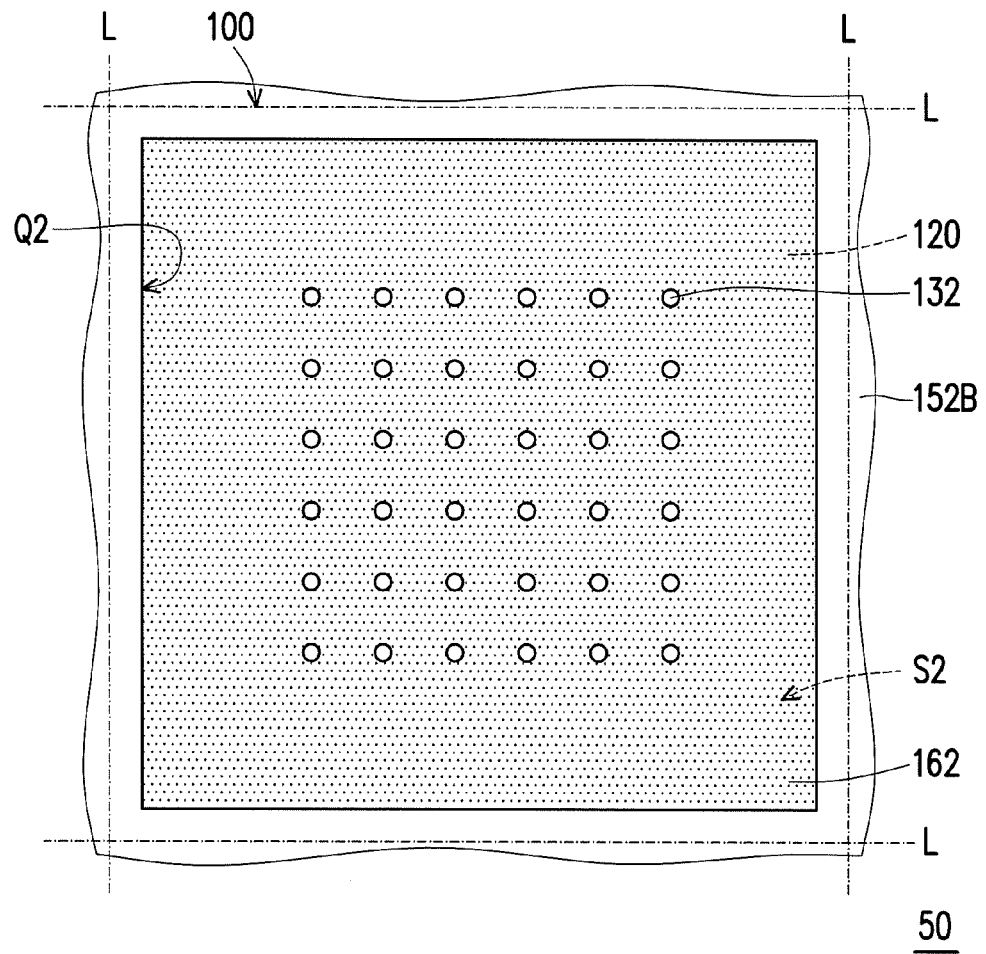
FIG. 3A and FIG. 3B are respectively top views of the structures of FIG. 2H and FIG. 2I.
Figure 4E:
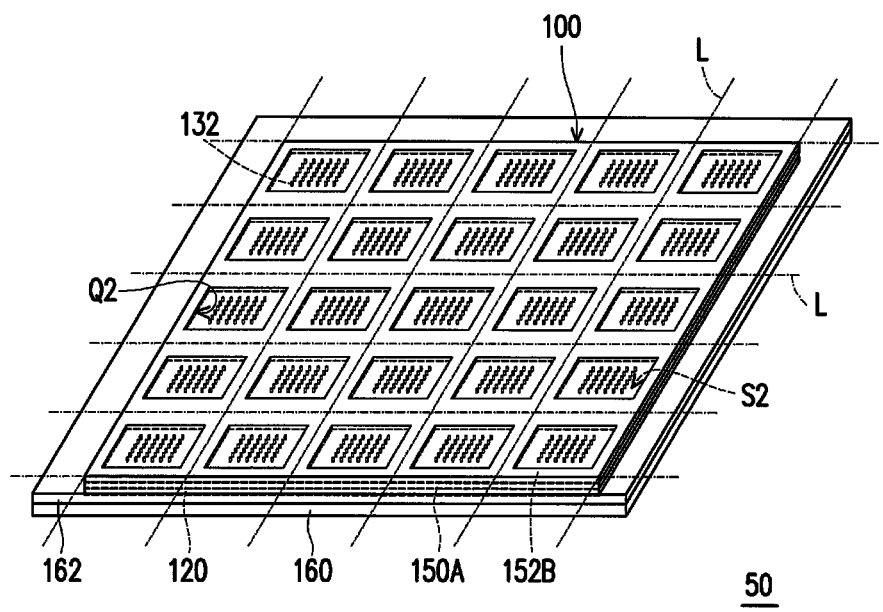
FIG. 4E is a perspective view of the structures of FIG. 1H, FIG. 2H, and FIG. 3A in complete state.

Referring to FIG. 1H, FIG. 2H, FIG. 3A, and FIG. 4E, the structures of FIG. 1H, FIG. 2H, and FIG. 3A in complete state are shown in FIG. 4E, i.e., the structure of FIG. 4E is partially shown in FIG. 1H, FIG. 2H, and FIG. 3A. After the above steps, a portion of the first encapsulated material 160 and a portion of the second encapsulated material 162 can further be removed such that the first supporting structure 150A and the first bonding protruding portions 130 are exposed on the first encapsulated material 160, and the second supporting structure 152B and the second bonding protruding portions 132 are exposed on the second encapsulated material 162 such that the first bonding protruding portions 130 and the second bonding protruding portions 132 are used for the subsequent bonding of other devices or apparatuses. Specifically, in the present embodiment, a portion of the first encapsulated material 160 protruding beyond the first bonding protruding portions 130 and a portion of the second encapsulated material 162 protruding beyond the second bonding protruding portions 132 can be removed via a process method such as etching, sandblasting, or polishing, such that the first bonding protruding portions 130 and the second bonding protruding portions 132 can respectively expose the first encapsulated material 160 and the second encapsulated material 162. Moreover, in the present embodiment, the area of the second bonding protruding portions 132 exposed on the second encapsulated material 162 is less than the area of the first bonding protruding portions 130 exposed on the first encapsulated material 160 to achieve the object of a fan-out signal to a circuit to be subsequently bonded with a target. Moreover, the exposed portions of the first bonding protruding portions 130 and the second bonding protruding portions 132 protruding beyond the first encapsulated material 160 and the second encapsulated material 162 can be decided based on the change in the target to be bonded, and the invention is not limited thereto. At this point, the electronic structure array 50 is complete, and the electronic structure array 50 contains a plurality of uncut electronic structures 100 as shown in FIG. 4E.

Figure 1I:
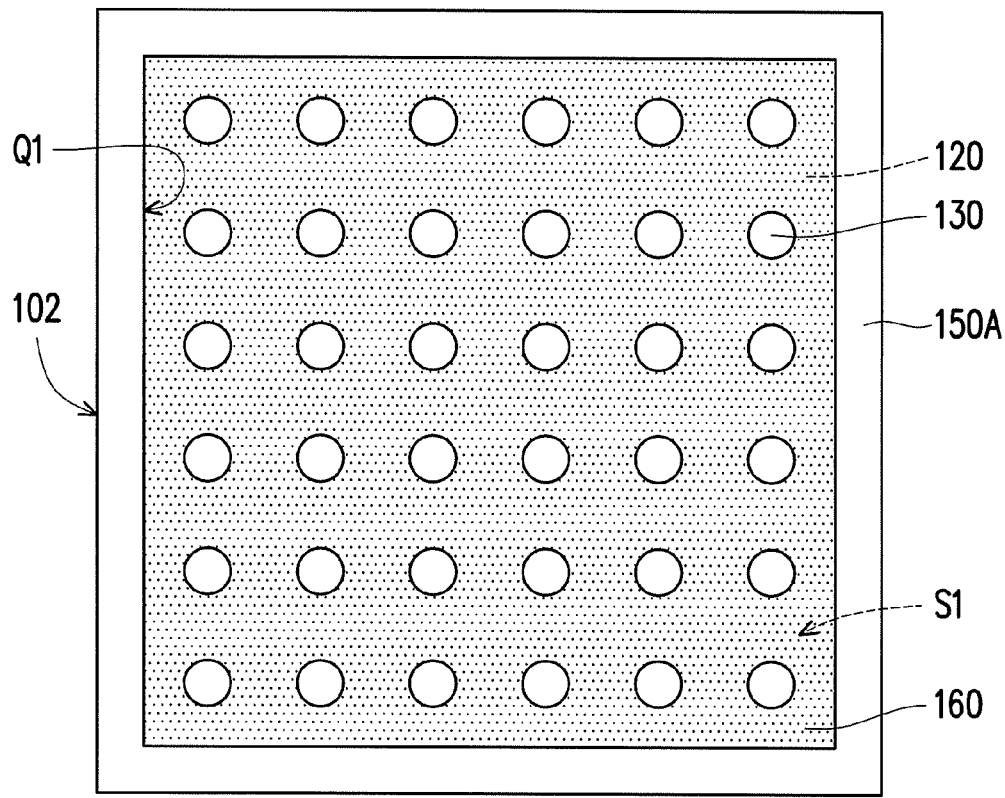
Figure 2I:
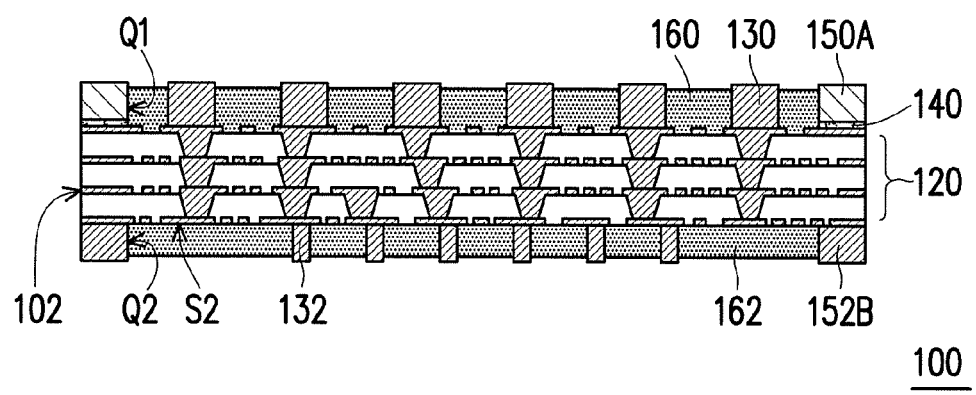

Please refer to FIG. 1I, FIGS. 2I, and 3B. After the above steps, the first supporting structure 150A, the second supporting structure 152B, and the redistribution structure 120 are cut along a plurality of cutting lines L between the first openings Q1 (refer to FIG. 1H, FIG. 2H, FIG. 3A, and FIG. 4E) to form a plurality of electronic structures 100. In other words, each of the electronic structures 100 formed by cutting the first supporting structure 150A and the second supporting structure 152B along the cutting lines L has a portion of the first supporting structure 150A and a portion of the second supporting structure 152B, and the portion of the first supporting structure 150A and the portion of the second supporting structure 152B are two annular reinforced supporting members for a single electronic structure 100, and can increase the overall structural strength of the electronic structure 100, in particular at locations having a smaller overall structural thickness. More specifically, since the two annular reinforced supporting members are formed by cutting along the cutting lines L, the two reinforced supporting members are both exposed at a side 102 of a single electronic structure 100, and therefore better protection is provided to the peripheral region of the electronic structure 100. Similarly, the redistribution structure 120 is also cut along the cutting lines L such that a portion of the redistribution structure 120 is exposed at the side 102 of a single electronic structure 100.

Referring further to FIG. 1H, FIG. 2H, FIG. 3A, and FIG. 4E, specifically, in the present embodiment, the electronic structure array 50 includes a plurality of electronic structures 100, and the electronic structures 100 are suitable for array arrangement to form the electronic structure array 50 as shown in FIG. 4E. Each of the electronic structures 100 includes a redistribution structure 120, a first supporting structure 150A, a second supporting structure 152B, a plurality of first bonding protruding portions 130, a plurality of second bonding protruding portions 132, a first encapsulated material 160, and a second encapsulated material 162. The first supporting structure 150A has a first opening Q1 and is disposed on a first surface S1 of the redistribution structure 120. The second supporting structure 152B has a second opening Q2 disposed on a second surface S2 of the redistribution structure 120 opposite to the first surface S1. The plurality of first bonding protruding portions 130 is disposed on the first surface S1 of the redistribution structure 120 and located in the first opening Q1. The plurality of second bonding protruding portions 132 is disposed on the second surface S2 of the redistribution structure 120 and located in the second opening Q2. The first encapsulated material 160 is filled between the first opening Q1 and the first bonding protruding portions 130. The second encapsulated material 162 is filled between the second opening Q2 and the second bonding protruding portions 132. In other words, the electronic structures 100 are formed by cutting the electronic structure array 50, and therefore the redistribution structure 120, the first supporting structure 150A, and the second supporting structure 152B are also formed in each of the electronic structures 100 by cutting. Since the first supporting structure 150A and the second supporting structure 152B are disposed in the peripheral region of each of the electronic structures 100 of the electronic structure array 50, warping occurring in the packaging process of the electronic structure array 50 can be alleviated, and the structural strength of the electronic structure array 50 can be increased and production cost of the manufacture thereof can be reduced, such that the yield of the electronic structure 100 is increased. Moreover, the disposition of the first supporting structure 150A and the second supporting structure 152B can also improve the overall structural strength of each of the electronic structures 100.

Referring further to FIG. 1I, FIG. 2I, and FIG. 3B, specifically, in the present embodiment, the electronic structures 100 include a redistribution structure 120, a first supporting structure 150A, a second supporting structure 152B, a plurality of first bonding protruding portions 130, a plurality of second bonding protruding portions 132, a first encapsulated material 160, and a second encapsulated material 162. The first supporting structure 150A has a first opening Q1 and is disposed on a first surface S1 of the redistribution structure 120. The second supporting structure 152B has a second opening Q2 and is disposed on a second surface S2 of the redistribution structure 120 opposite to the first surface S1. The plurality of first bonding protruding portions 130 is disposed on the first surface S1 of the redistribution structure 120 and located in the first opening Q1. The plurality of second bonding protruding portions 132 is disposed on the second surface S2 of the redistribution structure 120 and located in the second opening Q2. The first encapsulated material 160 is filled between the first opening Q1 and the first bonding protruding portions 130. The second encapsulated material 162 is filled between the second opening Q2 and the second bonding protruding portions 132. In particular, the electronic structures 100 are formed by cutting the electronic structure array 50 (refer to FIG. 4E), and therefore the redistribution structure 120, the first supporting structure 150A, and the second supporting structure 152B are also formed in each of the electronic structures 100 by cutting. Since the first supporting structure 150A and the second supporting structure 152B are disposed in the peripheral region of the electronic structures 100, the overall structural strength of the electronic structures 100 can be improved, in particular at locations having a smaller overall structural thickness.

Figure 5:
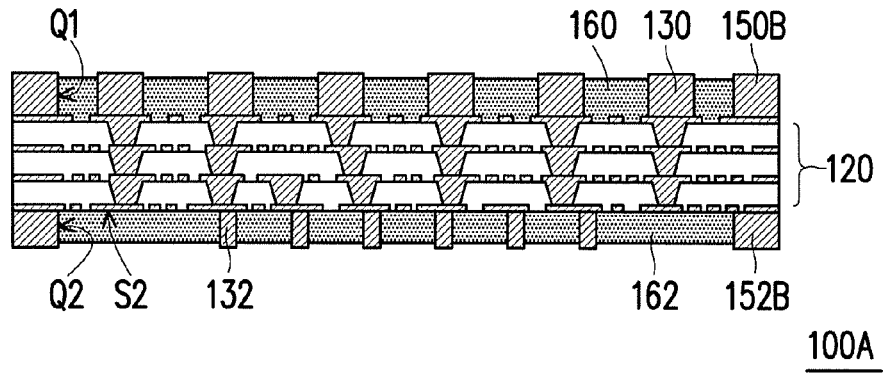
FIG. 5 is a cross-sectional view of the electronic structure of another embodiment of the invention.

Referring to FIG. 5, electronic structures 100A of the present embodiment are similar to the electronic structures 100 of FIG. 2I, and the main difference between the two is that, in the step of forming the plurality of first bonding protruding portions 130 on the redistribution structure 120 (refer to FIG. 2B), the first supporting structure 150B and the first bonding protruding portions 130 are formed on the redistribution structure 120 via electroplating at the same time, that is, the first supporting structure 150B and the first bonding protruding portions 130 are integrally formed. As a result, the material for forming the first supporting structure 150B can be reduced.

Figure 6:
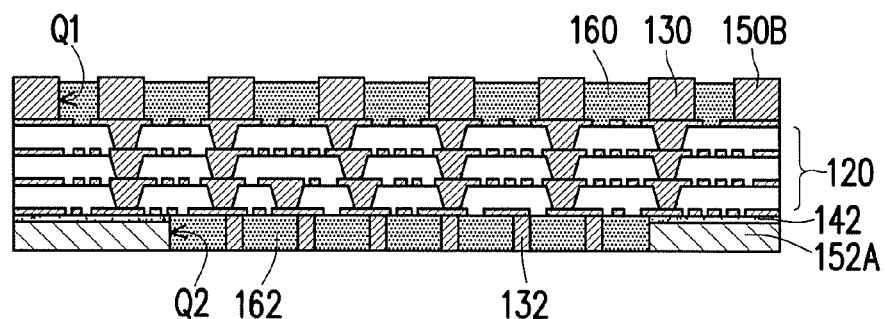
FIG. 6 is a cross-sectional view of the electronic structure of yet another embodiment of the invention.

Referring to FIG. 6, electronic structures 100B of the present embodiment are similar to the electronic structures 100A of FIG. 5, and the main difference between the two is that, in the step of forming the plurality of second bonding protruding portions 132 on the redistribution structure 120, the second supporting structure 152A is adhered on the redistribution structure 120 via a second adhesive layer 142 such that the second supporting structure 152A is fixed on the redistribution structure 120. Specifically, the second adhesive layer 142 is disposed between the redistribution structure 120 and the second supporting structure 152A. As a result, the supporting structure having a plurality of openings can alleviate warping occurring in the packaging process, in particular at locations having a smaller overall structural thickness.

Figure 7:
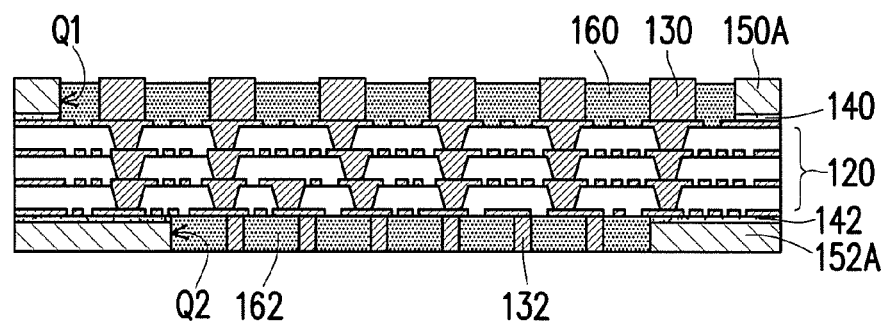
FIG. 7 is a cross-sectional view of the electronic structure of still yet another embodiment of the invention.

Referring to FIG. 7, electronic structures 100C of the present embodiment are similar to the electronic structures 100 of FIG. 2I, and the main difference between the two is that, in the step of forming the plurality of second bonding protruding portions 132 on the redistribution structure 120 (refer to FIG. 2F), the second supporting structure 152A is adhered on the redistribution structure 120 via the second adhesive layer 142 such that the second supporting structure 152A is fixed on the redistribution structure 120. Specifically, the second adhesive layer 142 is disposed between the redistribution structure 120 and the second supporting structure 152A. As a result, the supporting structure having a plurality of openings can alleviate warping occurring in the packaging process, in particular at locations having a smaller overall structural thickness.

Figure 8A:
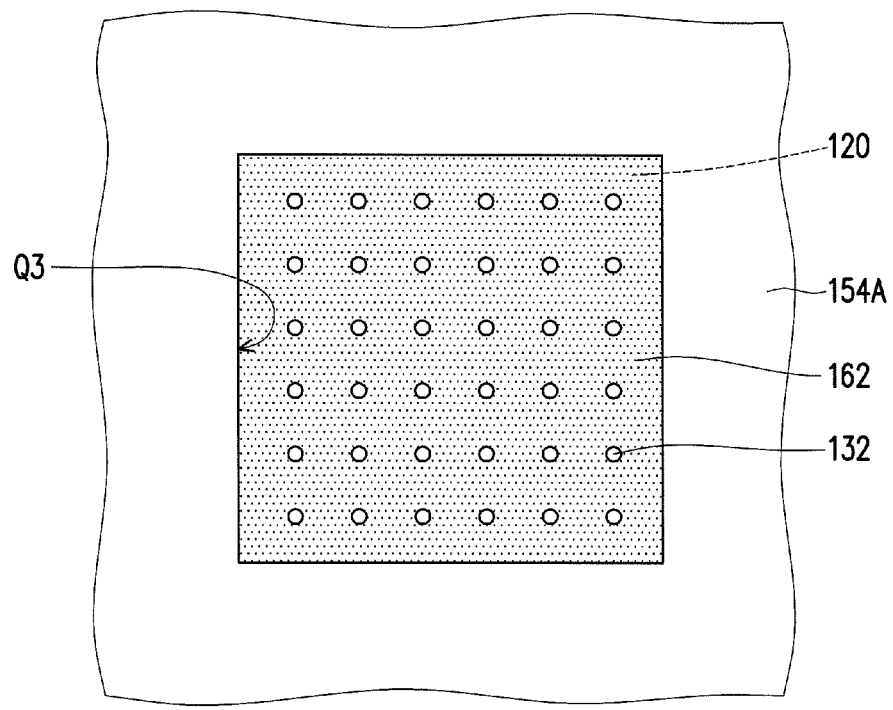
FIG. 8A to FIG. 8C are bottom views of a subsequent process of the electronic structure process of FIG. 2H in order.
Figure 9A:
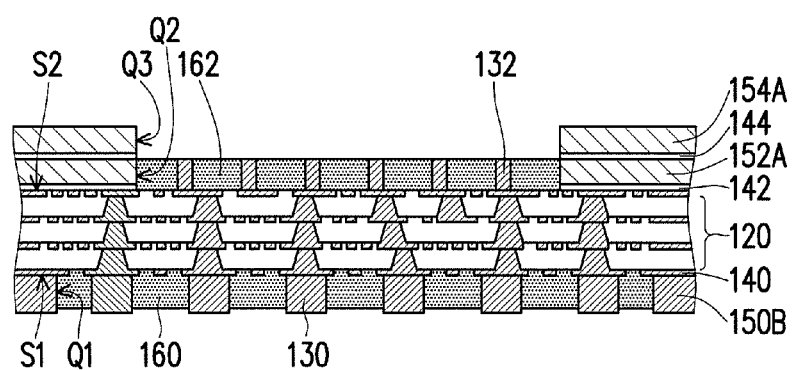
FIG. 9A to FIG. 9C are respectively cross-sectional views of the structures of FIG. 8A to FIG. 8C along line A-A' of FIG. 1A.

Please refer to FIG. 8A and FIG. 9A. After the step of removing a portion of the first encapsulated material 160 and a portion of the second encapsulated material 162, a third supporting structure 154A is formed on the second supporting structure 152A, wherein the second supporting structure 152A is located between the first supporting structure 150B and the third supporting structure 154A, and the third supporting structure 154A has a plurality of third openings Q3. In the step of forming the third supporting structure 154A on the second supporting structure 152A, the third supporting structure 154A is adhered on the second supporting structure 152A via a third adhesive layer 144, wherein the third supporting structure 154A is a reticular structure such as one reticular reinforced supporting member. As a result, warping occurring to the target subsequently to be bonded on the second bonding protruding portions 132 in the packaging process thereof can be alleviated and the overall structural strength can be improved, in particular at locations having a smaller overall structural thickness.

Figure 8B:
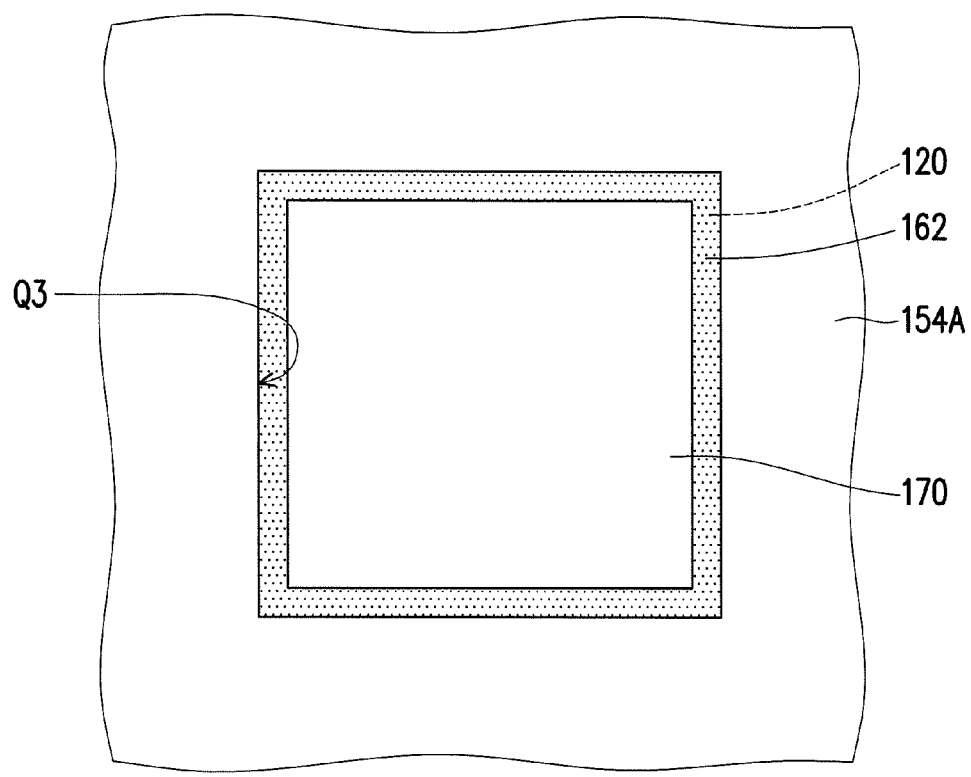
Figure 9B:
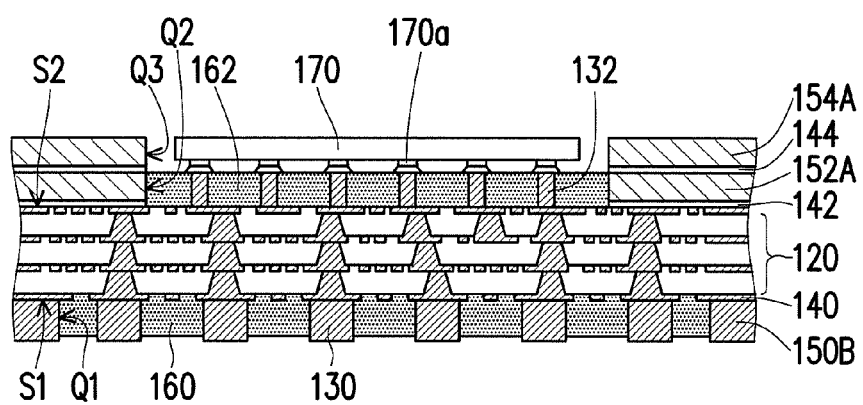

Please refer to FIG. 8B and FIG. 9B. After the above steps, a chip 170 is disposed in each of the third openings Q3, and the chips 170 are connected to the plurality of second bonding protruding portions 132 in the corresponding second opening Q2. In other words, one chip 170 is disposed on the plurality of second bonding protruding portions 132 in each of the second openings Q2, but in other embodiments, two or more chips can also be disposed, and the invention is not limited thereto. Specifically, the chips 170 are disposed and directly connected to the second bonding protruding portions 132, and via the disposition of the redistribution structure 120, the signal on the chips 170 can be fanned-out to outside the projection region of the chips 170 of the redistribution structure 120 to improve the flexibility of signal disposition of the chips 170. Moreover, the second bonding protruding portions 132 can be directly electrically connected to a pad 170a on the chips 170 without the addition of bumps. Moreover, a plurality of solder balls (not shown) can be further disposed on the first bonding protruding portions 130, and the redistribution structure 120 is located between the chips 170 and the solder balls.

Figure 8C:
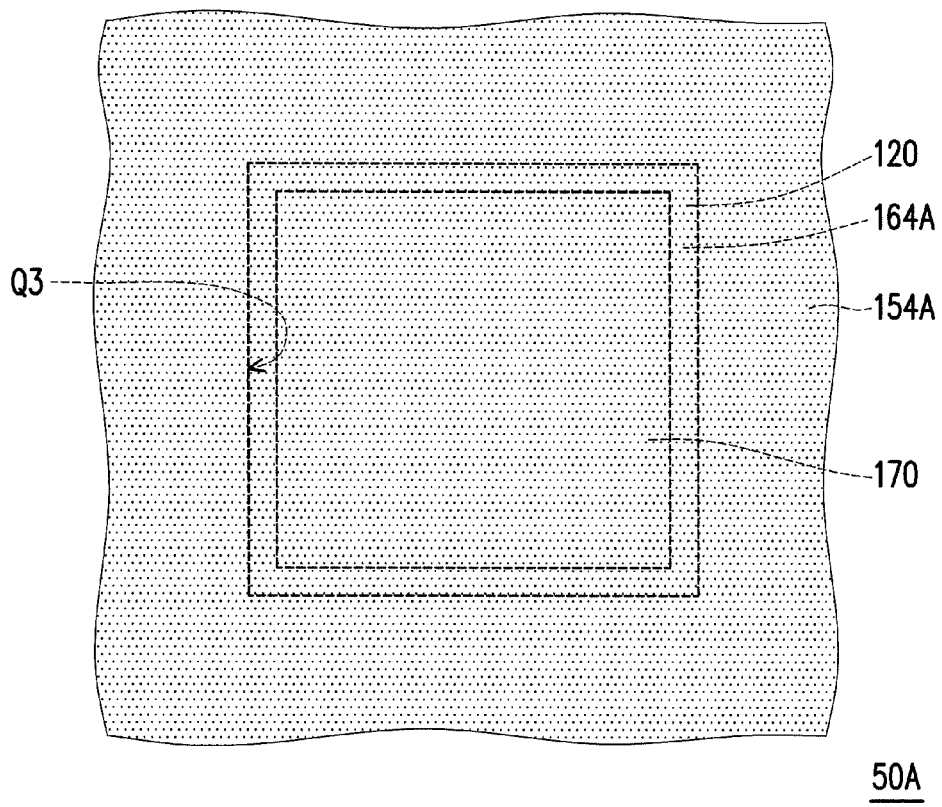
Figure 9C:
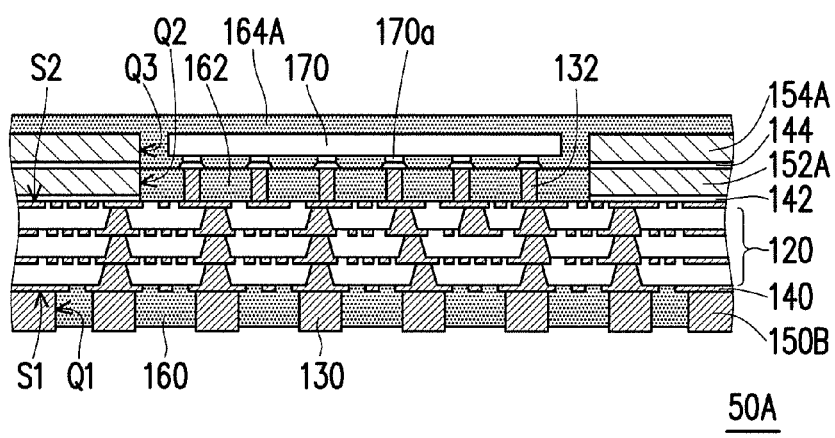

Please refer to FIG. 8C and FIG. 9C. After the above steps, a third encapsulated material 164A is formed on the second encapsulated material 162, and the third encapsulated material 164A is filled between the second encapsulated material 162 and the corresponding chip 170 to complete a chip package array 50A. In other words, in the present step, the third encapsulated material 164A is filled on the second encapsulated material 162 and completely covers the third supporting structure 154A and the chips 170 such that the third encapsulated material 164A is completely filled in each of the third openings Q3 in the third supporting structure 154A to fix the third supporting structure 154A and the chips 170.

Figure 10A:
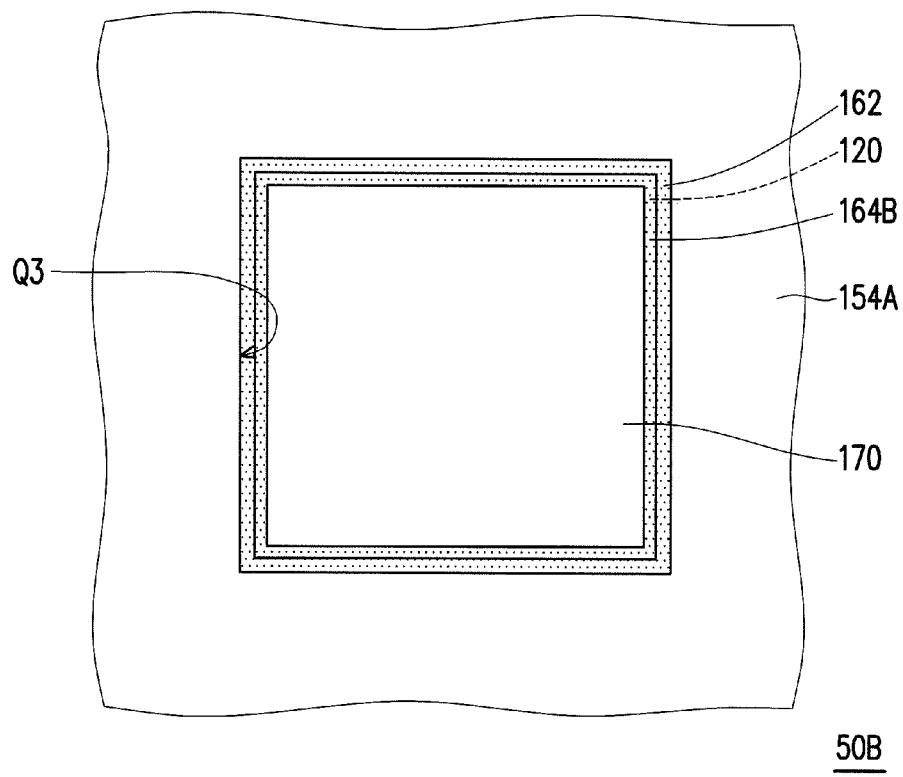
FIG. 10A is a top view of a subsequent process of another embodiment of the electronic structure process of FIG. 8B.
Figure 10B:
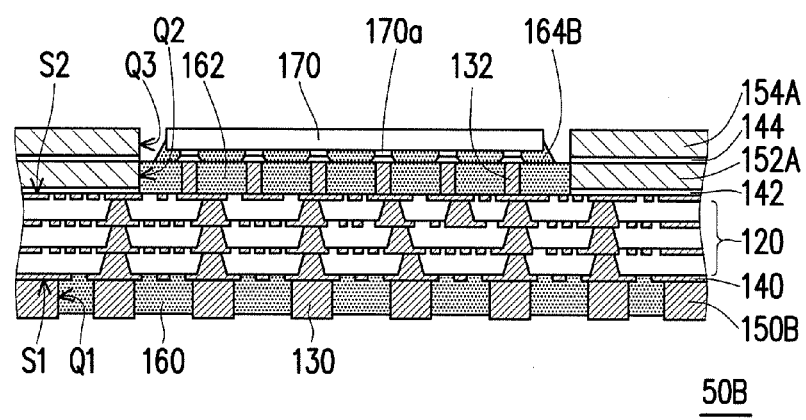
FIG. 10B is a cross-sectional view of the structure of FIG. 10A along line A-A' of FIG. 1A.

Please refer to FIG. 10A and FIG. 10B. The electronic structure process steps of the present embodiment are similar to the electronic structure process steps of FIG. 8C and FIG. 9C, and the main difference between the two is the disposition of the third encapsulated material 164B. Specifically, in the above steps, the third encapsulated material 164B can only be filled between the second encapsulated material 162 and the corresponding chip 170, or a portion of the third encapsulated material 164A is removed (refer to FIG. 8C and FIG. 9C) to form the third encapsulated material 164B to expose the chips 170 to complete a chip package array 50B. As a result, the chips 170 can be exposed outside the electronic structure array 50B to be in contact with a thermal conductor such that a single subsequently cut electronic structure can have better heat dissipation.

Based on the above, in the electronic structure process of the invention, since a supporting structure is disposed in the peripheral region of each of the electronic structures of the electronic structure array, warping occurring in the process can be alleviated, in particular at locations having a smaller overall structural thickness, and the structural strength of the electronic structure array can be increased and production cost of the process thereof can be reduced, such that the yield of the electronic structure is increased. Moreover, the disposition of the supporting structure can also improve the overall structural strength of each of the electronic structures.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An electronic structure process, comprising:
providing a redistribution structure and a carrier plate, wherein the redistribution structure is disposed on the carrier plate;
forming a plurality of first bonding protruding portions and a first supporting structure on the redistribution structure, wherein the first supporting structure has a plurality of first openings, and the first bonding protruding portions are located in the first openings;
forming a first encapsulated material filled between the first openings and the first bonding protruding portions;
removing the carrier plate;
forming a plurality of second bonding protruding portions and a second supporting structure on the redistribution structure, wherein the second supporting structure has a plurality of second openings, the second bonding protruding portions are located in the second openings, and the redistribution structure is located between the first supporting structure and the second supporting structure;
forming a second encapsulated material filled between the second openings and the second bonding protruding portions.

2. The electronic structure process of claim 1, further comprising:
cutting the first supporting structure, the second supporting structure, and the redistribution structure along a plurality of cutting lines between the first openings to form a plurality of electronic structures.

3. The electronic structure process of claim 2, wherein a portion of the first supporting structure and a portion of the second supporting structure are exposed on the redistribution structure.

4. The electronic structure process of claim 1, wherein the first supporting structure and the second supporting structure are reticular structures.

5. The electronic structure process of claim 1, further comprising:
removing a portion of the first encapsulated material and a portion of the second encapsulated material such that the first supporting structure and the first bonding protruding portions are exposed on the first encapsulated material, and the second supporting structure and the second bonding protruding portions are exposed on the second encapsulated material.

6. The electronic structure process of claim 1, wherein the first bonding protruding portions and the second bonding protruding portions are formed by electroplating, and an area of the second bonding protruding portions exposed on the second encapsulated material is less than an area of the first bonding protruding portions exposed on the first encapsulated material.

7. The electronic structure process of claim 1, wherein the first supporting structure and the first bonding protruding portions are formed by electroplating at the same time.

8. The electronic structure process of claim 1, wherein the second supporting structure and the second bonding protruding portions are formed by electroplating at the same time.

9. The electronic structure process of claim 1, wherein the step of forming the first supporting structure on the redistribution structure further comprises:
adhering the first supporting structure on the redistribution structure via a first adhesive layer.

10. The electronic structure process of claim 1, wherein the step of forming the second supporting structure on the redistribution structure further comprises:
adhering the second supporting structure on the redistribution structure via a second adhesive layer.

11. The electronic structure process of claim 1, further comprising:
forming a third supporting structure on the second supporting structure, wherein the second supporting structure is located between the first supporting structure and the third supporting structure, and the third supporting structure has a plurality of third openings;
disposing at least one chip in each of the third openings, wherein the at least one chip is connected to the second bonding protruding portions in the corresponding second opening; and
forming a third encapsulated material on the second encapsulated material, wherein the third encapsulated material is filled between the second encapsulated material and each of the corresponding at least one chip.

12. The electronic structure process of claim 11, wherein the third supporting structure is a reticular structure.

13. The electronic structure process of claim 11, wherein the step of forming the third supporting structure on the second supporting structure further comprises:
adhering the third supporting structure on the second supporting structure via a third adhesive layer.

14. The electronic structure process of claim 11, wherein the third encapsulated material covers the third supporting structure and the chips.

* * * * *